United States Patent
Thomas et al.

(10) Patent No.: US 8,294,501 B1
(45) Date of Patent: Oct. 23, 2012

(54) MULTIPHASE CLOCK GENERATION AND CALIBRATION

(75) Inventors: Christopher Thomas, San Diego, CA (US); Yanggao Qiu, Shenzhen (CN); Junling Zang, Shenzhen (CN); Wei Fu, San Diego, CA (US)

(73) Assignee: SMSC Holdings S.a.r.l., Luxembourg (LU)

( * ) Notice: Subject to any disclaimer, the term of this patent is extended or adjusted under 35 U.S.C. 154(b) by 61 days.

(21) Appl. No.: 13/035,331

(22) Filed: Feb. 25, 2011

(51) Int. Cl.
*H03H 11/16* (2006.01)

(52) U.S. Cl. ........................ 327/237; 327/233

(58) Field of Classification Search .................. None
See application file for complete search history.

(56) References Cited

U.S. PATENT DOCUMENTS

| 7,317,775 | B1 * | 1/2008 | Erhart et al. ................... 375/355 |
| 7,483,508 | B2 * | 1/2009 | Staszewski et al. ........... 375/376 |
| 2010/0264968 | A1 * | 10/2010 | Ko et al. ....................... 327/158 |

* cited by examiner

*Primary Examiner* — Cassandra Cox

(57) ABSTRACT

Systems and methods are disclosed for improving the accuracy of phase spacing of multiphase clocks. In one example, method includes receiving a reference clock having a first frequency and sampling the reference clock with a plurality of multiphase clocks having a second frequency to generate a plurality of samples. The second frequency is a non-integer multiple of the first frequency. The method also includes detecting transitions of the reference clock occurring between the samples generated from a plurality of pairs of the multiphase clocks and counting the transitions to generate a transition count for each pair of the multiphase clocks. The method also includes summing a set of the transition counts to generate a measured phase for a first multiphase clock, calculating a reference phase for the first multiphase clock, and generating a phase skew value for the first multiphase clock based on the measured phase and the reference phase.

22 Claims, 10 Drawing Sheets

MULTIPHASE CLOCK GENERATION AND CALIBRATION

BACKGROUND

1. Field of the Invention

The present invention generally relates to data communication and, more particularly, to sampling data in communication receivers.

2. Related Art

Multiphase clocks having the same frequency but different phase offsets are widely used in high speed data applications such as high speed serial-deserializers and high speed analog digital converters. Use of the multiphase clocks allows for high speed operation without the need for a high speed clock by running the multiphase clocks at a lower frequency.

However, performance of multiphase operation is limited by the accuracy of the phase spacing of the multiphase clocks. In practice, clocks may be generated from crystals and oscillator circuits. Manufacturing tolerances of the crystals and oscillator circuits may cause small deviations in the frequency characteristics of the generated clocks from their nominal values. In addition, operating conditions such as fluctuations in voltage and temperature may induce further variance in the clock characteristics. As such, phase offsets of multiphase clocks may not have equal phase spacing. Accordingly, there is a need for an improved approach to the operation of multiphase clocks to address such inaccuracies.

SUMMARY

Systems and methods are provided to permit measurements of phase offsets of multiphase clocks in clock generation blocks of high speed data receivers. Phase skews of the multiphase clocks from equal phase spacing are measured by counting transitions of a reference clock. The measured phase skews may be used to adjust the phase offsets so that the multiphase clocks have substantially equally spaced phase offsets.

In accordance with one or more embodiments of the present disclosure, a method includes receiving a reference clock; sampling the reference clock with a plurality of multiphase clocks to generate a plurality of samples, wherein the reference clock has a first frequency and the multiphase clocks have a second frequency, wherein the second frequency is a non-integer multiple of the first frequency; detecting transitions of the reference clock occurring between the samples generated from a plurality of pairs of the multiphase clocks; counting the transitions to generate a transition count for each of the pairs of the multiphase clocks; summing a set of the transition counts to generate a measured phase for a first one of the multiphase clocks; calculating a reference phase for the first one of the multiphase clocks; and generating a phase skew value for the first one of the multiphase clocks based on the measured phase and the reference phase.

In accordance with one or more embodiments of the present disclosure, an apparatus includes a plurality of oversampling registers adapted to store a plurality of samples of a reference clock sampled with a plurality of multiphase clocks, wherein the reference clock has a first frequency and the multiphase clocks have a second frequency, wherein the second frequency is a non-integer multiple of the first frequency; a transition detect block adapted to detect transitions of the reference clock occurring between the samples generated from a plurality of pairs of the multiphase clocks; an accumulator block adapted to count the transitions to generate a transition count for each of the pairs of the multiphase clocks; and a phase skew generate block adapted to sum a set of the transition counts to generate a measured phase for a first one of the multiphase clocks, calculate a reference phase for the first one of the multiphase clocks, and generate a phase skew value for the first one of the multiphase clocks based on the measured phase and the reference phase.

In accordance with one or more embodiments of the present disclosure, a machine readable medium is adapted to store a plurality of non-transitory machine readable instructions which when executed by one or more processors of a device are adapted to cause the device to sample a reference clock with a plurality of multiphase clocks to generate a plurality of samples, wherein the reference clock has a first frequency and the multiphase clocks have a second frequency, wherein the second frequency is a non-integer multiple of the first frequency; detect transitions of the reference clock occurring between the samples generated from a plurality of pairs of the multiphase clocks; count the transitions to generate a transition count for each of the pairs of the multiphase clocks; sum a set of the transition counts to generate a measured phase; calculate a reference phase; and generate a phase skew value based on the measured phase and the reference phase.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

Various techniques are provided which may be used to improve the accuracy of phase spacing of multiphase clocks in data receivers. In various embodiments, the multiphase clocks have a common frequency but are separated by substantially equally spaced phase offsets. The multiphase clocks may have a lower frequency than the frequency of high speed data received by the data receivers. The multiphase clocks may be used to sample the high speed data so as to allow subsequent processing of the received data to operate at the lower speed of the multiphase clocks. Performance of the data receivers may be determined by the accuracy with which the phase offsets of the multiphase clocks are measured and maintained.

In various embodiments, the phase offsets of the multiphase clocks may be measured by oversampling a lower speed reference clock having a non-fixed phase relationship with respect to the multiphase clocks. Deviations from ideal phase offsets may be measured and may be used to adjust the phase offsets of the multiphase clocks. Hereinafter, various embodiments of the present disclosure will be explained in further detail with reference to the accompanying figures.

Figure 1:
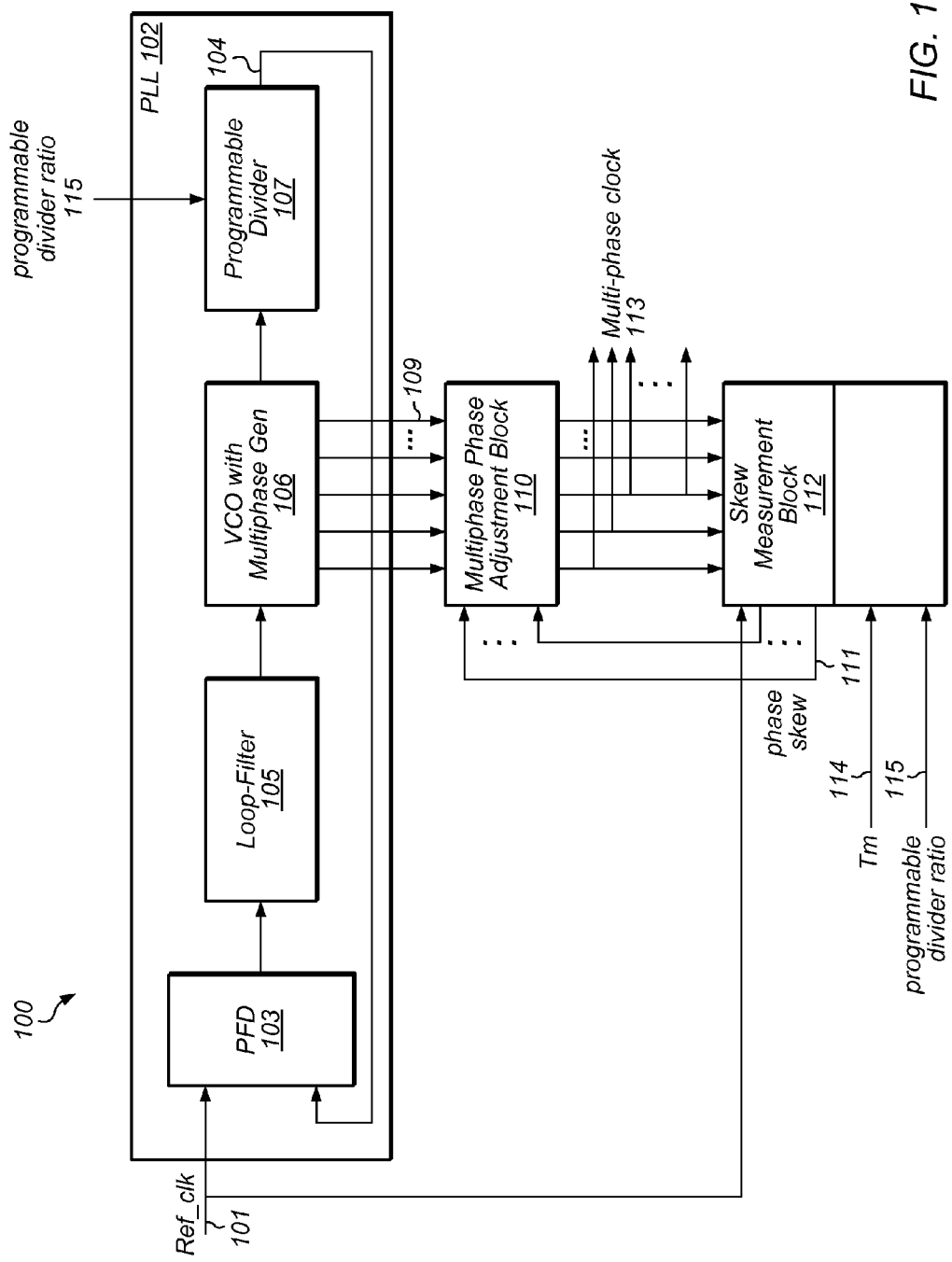
FIG. 1 shows a system to generate multiphase clocks, to measure phase offsets between the multiphase clocks, and to adjust the phase offsets to maintain substantially equal phase offsets according to one or more embodiments of the present disclosure.

FIG. 1 shows a system 100 to generate multiphase clocks, to measure phase offsets between the multiphase clocks, and to adjust the phase offsets to maintain substantially equal phase offsets between the multiphase clocks according to one or more embodiments of the present disclosure. In one embodiment, system 100 may be provided as part of a data receiver. A reference clock ref_clk 101 is received by a fractional phase lock loop (PLL) 102, to generate a set of multiphase clocks 109 for subsequent phase skew measurement and adjustment. In this regard, multiphase clocks 109 may not have exactly equally spaced phase offsets, but rather may exhibit phase skews. PLL 102 includes a phase frequency detector (PFD) 103, a loop filter 105, a voltage controlled oscillator (VCO) with multiphase generator 106, and a programmable divider 107.

Programmable divider 107 determines the frequency scaling between multiphase clocks 109 and ref_clk 101. As will be discussed, ref_clk 101 is sampled by a set of multiphase clocks 113 and a phase relationship between ref_clk 101 and multiphase clocks 113 is measured as an indication of the phase offsets of multiphase clocks 109. To facilitate the phase offset measurements, the phase relationship between ref_clk 101 and multiphase clocks 109 is allowed to slowly change over time. In one embodiment, frequency scaling between multiphase clocks 109 and ref_clk 101 may be a non-integer value. For example, programmable divider 107 may have a fractional value of 100.0001 so that it will take 10,000 cycles of ref_clk 101 for it to drift across one period of multiphase clocks 109. In other words, the phase relationship between ref_clk 101 and multiphase clocks 109 repeats once for every 10,000 cycles of ref_clk 101. This slow rate of change in the phase relationship between ref_clk 101 and multiphase clocks 109 helps to ensure a substantially uniform distribution of transitions of ref_clk 101 across a period of multiphase clocks 109. Accordingly, slight deviations of the phase offsets of multiphase clocks 109 may be accurately measured and compensated.

Output of programmable divider 107 is a PLL divider output signal 104 that should run at the frequency of ref_clk 101 when PLL 102 is in lock. When PLL 102 is out of lock, PFD 103 detects any difference in the frequencies of ref_clk 101 and PLL divider output signal 104 to generate an error signal to loop filter 105. Loop filter 105 determines the closed loop response of PLL 102 to the error signal and generates an error voltage for VCO with multiphase generator 106 to adjust the frequency of multiphase clocks 109. VCO with multiphase generator 106 generates multiphase clocks 109 having a frequency that is scaled up from the frequency of ref_clk 101 by the frequency scaling in programmable divider 107. VCO with multiphase generator 106 also generates a VCO output having the same frequency as multiphase clocks 109 for programmable divider 107 to divide down to PLL divider output signal 104.

As an example of the generation of multiphase clocks 109, ref_clk 101 may have a frequency 25 MHz, and the frequency scaling in programmable divider 107 of PLL 102 may be 100.0001 so that multiphase clocks 109 have a frequency of 2.5000025 GHz. In this case, the phase relationship between ref_clk 101 and multiphase clocks 109 repeats once for every 10,000 cycles of ref_clk 101. If there are eight clocks in multiphase clocks 109, then phase spacing between the eight multiphase clocks 109 are approximately ⅛ of a period with some or all of the clocks exhibiting phase skews such that the clocks are not exactly spaced from each other at ⅛ of a period. In this regard, it will be appreciated that when multiphase clocks 109 are provided from PLL 102, they may be referred to as uncompensated multiphase clocks because their phase skews have not yet been compensated (e.g., adjusted) to exhibit more equal spacing. Any desired frequency and any desired number of multiphase clocks 109 and 113 may be used in other embodiments.

A multiphase phase adjustment block 110 receives multiphase clocks 109 and adjusts their phase offsets using a set of phase skew signals 111 received from a skew measurement block 112. In one embodiment, one of phase skew signals 111 is provided for each one of the multiphase clocks 109 to indicate the amount of phase skew (e.g., phase skew values) measured by skew measurement block 112. Multiphase phase adjustment block 110 adjusts the phase offset of multiphase clocks 109 in response to phase skew signals 111 to generate multiphase clocks 113 that exhibit phase offsets that are close to equal phase spacing within a pre-defined accuracy range. In this regard, multiphase clocks 113 may be referred to as compensated multiphase clocks because their phase skews may have been compensated (e.g., adjusted) to exhibit more equal spacing in response to phase skew signals 111.

Accordingly, it will be appreciated that where no phase adjustments have been performed by multiphase adjustment block 110 for one or more of multiphase clocks 113, such multiphase clocks 113 may correspond to (e.g., exhibit the same phase offsets) one or more of multiphase clocks 109. Similarly, it will be appreciated that where phase adjustments have been performed by multiphase adjustment block 110 for one or more of multiphase clocks 113, such multiphase clocks 113 may not correspond to (e.g., not exhibit the same phase offsets) one or more of multiphase clocks 109. Multiphase phase adjustment block 110 may adjust the phase offsets using phase interpolation, delay elements, and/or other techniques where appropriate.

Skew measurement block 112 receives multiphase clocks 113 and ref_clk 101 to measure phase skews of multiphase clocks 113. In one embodiment, skew measurement block 112 measures phase skews by detecting and accumulating (e.g., counting) the number of transitions of ref_clk 101 between sampling edges of multiphase clocks 113. As mentioned, the frequency scaling of PLL 102 is controlled to ensure a substantially uniform distribution of transitions of ref_clk 101 across a period of multiphase clocks 109. Such distribution will also be exhibited across a period of multiphase clocks 113. Therefore, the number of transitions of ref_clk 101 measured between sampling edges of a pair of multiphase clocks 113 is linearly proportional to the phase spacing between the pair of multiphase clocks 113.

The expected number of transitions of ref_clk 101 between the pair of multiphase clocks 113 is generated from an expected number of transitions of ref_clk 101 over a period of multiphase clocks 113 and the desired (e.g., ideal) phase offsets of the pair of multiphase clocks 113. In one embodiment, the expected number of transitions of ref_clk 101 is calculated from a sampling period Tm (e.g., a measurement period or a calibration period identified by a signal 114 provided to skew measurement block 112 as shown in FIG. 1), and a programmable divider ratio (e.g., also referred to as a PLL programmable divider ratio and identified by a signal 115 provided to programmable divider 107 and skew measurement block 112 as shown in FIG. 1) used by programmable divider 107 of PLL 102.

Phase skew between the pair of multiphase clocks 113 is then taken as the difference between the measured number of transitions and the expected number of transitions. In one embodiment, one of multiphase clocks 113 is selected. Phase skew signals 111 for the other multiphase clocks 113 with respect to the selected clock are generated from skew measurement block 112 for multiphase phase adjustment block 110 to adjust the phase offsets of multiphase clocks 113 to bring the phase skews of multiphase clocks 113 within an acceptable range.

Figure 2:
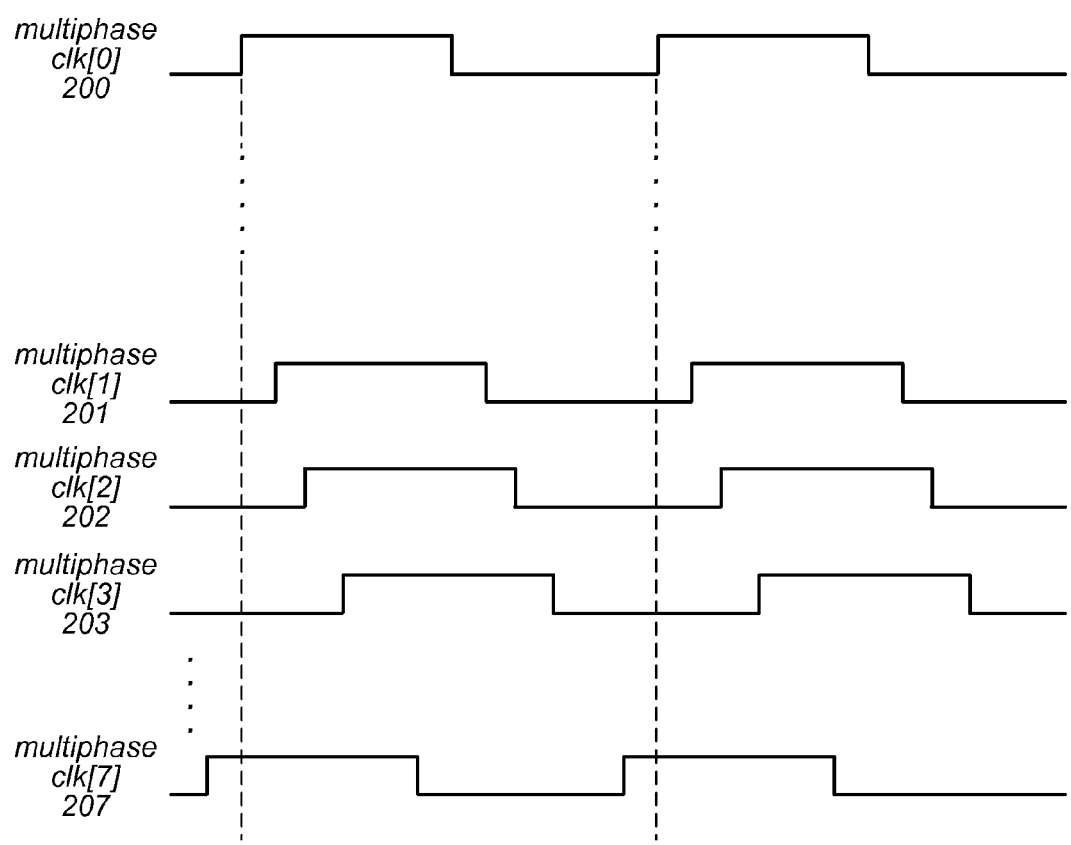
FIG. 2 shows phase relationships between multiphase clocks according to one or more embodiments of the present disclosure.

FIG. 2 shows phase relationships between multiphase clocks 113 of FIG. 1 according to one or more embodiments of the present disclosure. Eight of multiphase clocks 113 are shown as multiphase clk[0] 200, multiphase clk[1] 201, multiphase clk[2] 202, multiphase clk[3] 203, ..., multiphase clk[7] 207. In FIG. 2, the eight multiphase clocks 200 through 207 are shown as having substantially equal phase spacing. Therefore, if multiphase clk[0] 200 is the selected clock, and the period of multiphase clk[0] 200 is denoted as T, multiphase clk[1] 201 is phase offset by about T/8 from multiphase clk[0] 200, multiphase clk[2] 202 is phase offset by about 2T/8 offset from multiphase clk[0] 200, and multiphase clk[7] 207 is phase offset by about 7T/8 from multiphase clk[0] 200. These phase offsets are measured by counting the number of transitions of ref_clk 101 occurring within the phase offsets.

Figure 3:
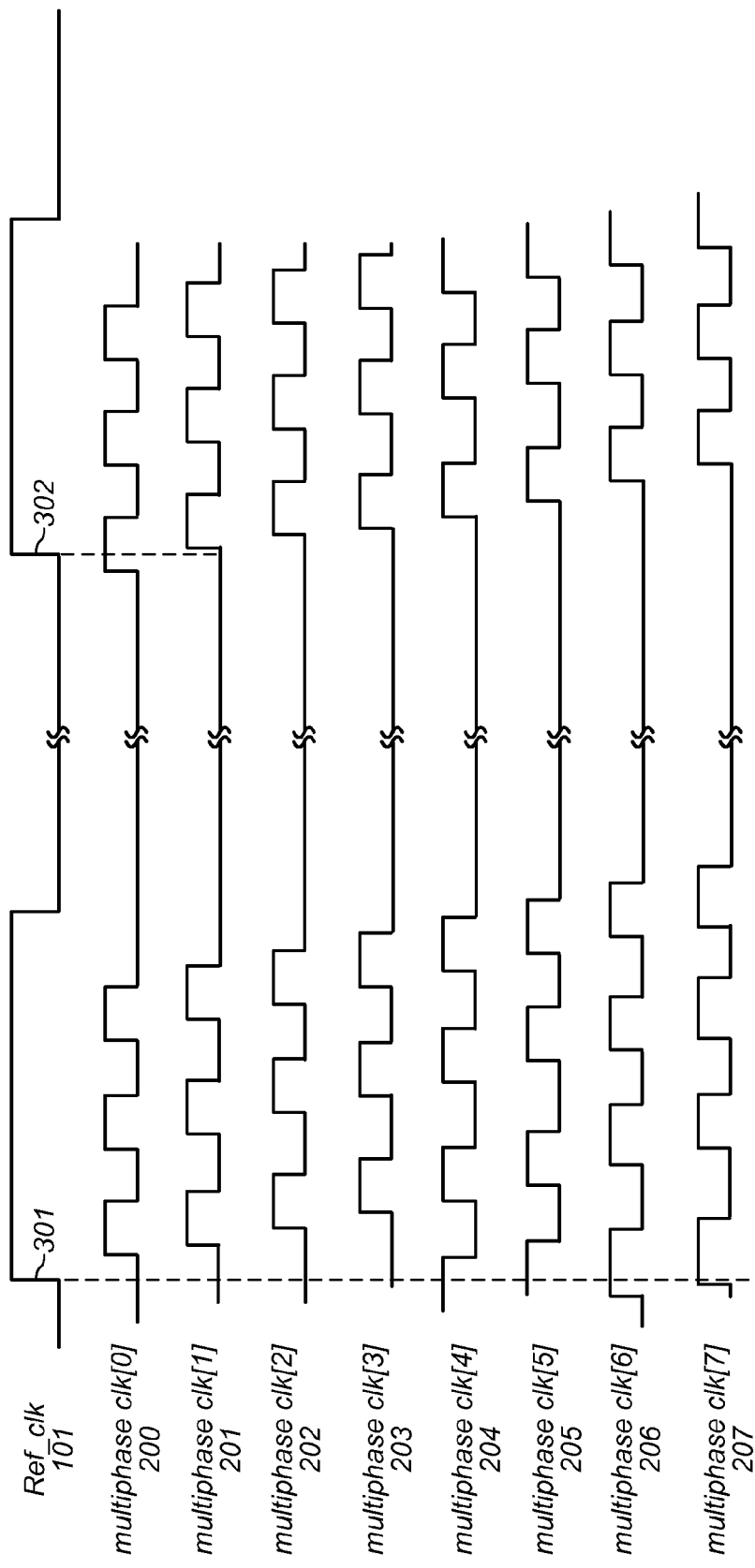
FIG. 3 illustrates data transitions of a lower speed reference clock drifting across phase offsets of higher speed multiphase clocks according to one or more embodiments of the present disclosure.

FIG. 3 illustrates data transitions of the lower speed reference clock ref_clk 101 drifting across phase offsets of higher speed multiphase clocks of FIG. 2 according to one or more embodiments of the present disclosure. Phase relationships between ref_clk 101 and multiphase clks[0-7] (200-207) change as the rising edge of ref_clk 101 drifts across a period of multiphase clks[0-7] (200-207). The speed of the drift of ref_clk 101 is determined by the programmable divider ratio of PLL 102 and may be made slow enough to ensure that the number of rising edges of ref_clk 101 across a period of multiphase clks[0-7] (200-207) is substantially uniformly distributed. In one embodiment, a first rising edge 301 of ref_clk 101 is initially between the sampling edges (e.g., rising edges) of multiphase clk[7] 207 and multiphase clk[0] 200 and will be detected as a transition between multiphase clk[7] 207 and multiphase clk[0] 200. After some time, the phase relationship between ref_clk 101 and multiphase clks [0-7] (200-207) changes so that a second rising edge 302 of ref_clk 101 drifts to an interval between the sampling edges (e.g., rising edges) of multiphase clk[0] 200 and multiphase clk[1] 201. Rising edge 302 will be detected as a transition between multiphase clk[0] 200 and multiphase clk[1] 201. By accumulating (e.g., counting) the number of transitions between the sampling edges of pairs of multiphase clks[0-7] (200-207), phase offsets between the pairs of multiphase clks[0-7] (200-207) may be measured.

Figure 4:
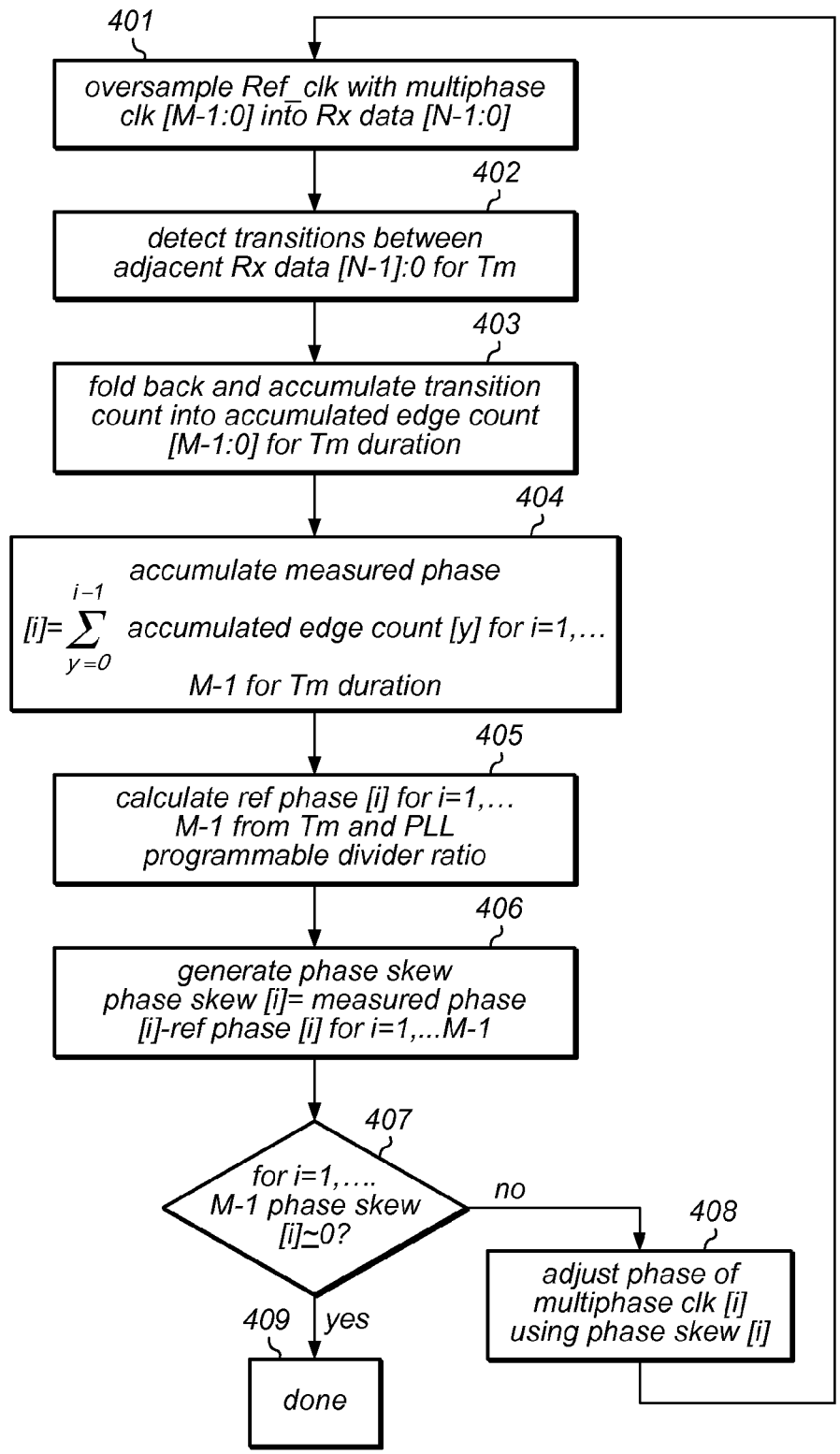
FIG. 4 shows a flow chart of a method for measuring and adjusting phase offsets of multiphase clocks according to one or more embodiments of the present disclosure.

FIG. 4 shows a flow chart of a method for measuring and adjusting phase offsets of multiphase clocks according to one or more embodiments of the present disclosure. The various operations (e.g., steps) of FIG. 4 may be performed by one or more components discussed herein.

In step 401, the lower speed ref_clk 101 is oversampled over a sampling period of Tm by M multiphase clocks (e.g., denoted as multiphase clks[M−1:0]) into N samples (e.g., denoted as Rxdata[N−1:0]). The N samples are arranged such that Rxdata[0], Rxdata[M], Rxdata[2M], and so forth are the samples of ref_clk 101 sampled by the sampling edge of multiphase clk[0]; Rxdata[1], Rxdata[M+1], Rxdata[2M+1], and so forth are the samples of ref_clk 101 sampled by the sampling edge of multiphase clk[1]; Rxdata[2], Rxdata[M+2], Rxdata[2M+2], and so forth are the samples of ref_clk 101 sampled by the sampling edge of multiphase clk[2]; and additional samples may be similarly sampled from remaining multiphase clk[3] to multiphase clk[M−1].

In step 402, transitions of ref_clk 101 occurring between adjacent samples of Rxdata[N−1:0] are detected. A transition occurring between adjacent samples of Rxdata[N−1:0] means that ref_clk 101 has a transition (e.g., a transition from a first value to a second value, or vice versa) between the sampling edges of the multiphase clocks corresponding to the adjacent samples of Rxdata[N−1:0]. For example, if a transition is detected between sample Rxdata[M] and sample Rxdata[M+1] (e.g., as evidenced by sample Rxdata[M] and sample Rxdata[M+1] having different values), then ref_clk 101 has a transition between sampling edges of multiphase clk[0] and clk[1].

The multiphase clocks may be grouped into pairs of adjacent multiphase clocks, wherein each pair includes multiphase clocks having adjacent sampling edges (e.g., with no intervening sampling edges of the other multiphase clocks). For example, multiphase clk[0] and clk[1] may be a pair, and multiphase clk[M−1] and clk[0] may be another pair. Thus, it will be appreciated that each multiphase clock may be a member of two pairs, and that M pairs are possible for M multiphase clocks.

In step 403, transitions of ref_clk 101 occurring between the sampling edges of each pair of the multiphase clocks are counted and stored as transition counts (e.g., also referred to as edge counts or accumulated edge counts). Accordingly, each of the M pairs of multiphase clocks will have an associated transition count for a total of M transition counts denoted as transition counts[M−1:0]. In one embodiment, transition count[0] represents the transition count of ref_clk 101 between sampling edges of adjacent multiphase clk[0] and clk[1]; transition count[1] represents the transition count of ref_clk 101 between sampling edges of adjacent multiphase clk[1] and clk[2]; and so forth.

In step 404, a measured phase is determined for each multiphase clock by summing various transition counts. In one embodiment, this is accomplished by selecting a first one of the multiphase clocks, selecting a second one of the multiphase clocks different from the first selected multiphase clock, and accumulating (e.g., summing) the transition counts for all pairs of adjacent multiphase clocks (e.g., intervening multiphase clocks) having a sampling edge of each multiphase clock of each pair that is between the sampling edges of the first and second selected multiphase clocks, or is the sampling edge of the first or the second selected multiphase clock. The sum of the transition counts may be used to represent a measured phase between the first and second selected multiphase clocks.

For example, if multiphase clk[0] is the first selected multiphase clock and multiphase clk [5] is the second selected multiphase clock, then the transition counts for pairs of the multiphase clocks between multiphase clk[0] and multiphase clk[5] are calculated. This is accomplished by summing the transition counts between the pair including multiphase clk [0] and multiphase clk[1] (e.g., transition count[0]), between the pair including multiphase clk[1] and multiphase clk[2] (e.g., transition count[1]), between the pair including multiphase clk[2] and multiphase clk[3] (e.g., transition count [2]), between the pair including multiphase clk[3] and multiphase clk[4] (e.g., transition count[3]), and between the pair including multiphase clk[4] and multiphase clk[5] (e.g., transition count[4]). Thus, transition count[0], transition count [1], transition count[2], transition count[3], and transition count[4] are summed to generate a measured phase[5] to represent the phase (e.g., the total transition count) between multiphase clk[0] and multiphase clk[5].

Transition counts may be accumulated for all remaining multiphase clocks to provide a plurality of measured phases. For example, in one embodiment, a total of M−1 measured phases may be generated to represent transition counts between the first selected multiphase clock and each of the remaining multiphase clocks (e.g., M−1 different clocks may be used as the second selected multiphase clock). These M−1 measured phases are denoted as measured phases[M−1:1]. In one embodiment, for an index i between [M−1:1], measured phase[i] is calculated from summing the transition counts from transition count[0] to transition count[i−1].

In step 405, a reference phase is determined for each multiphase clock. In one embodiment, M−1 reference phases are calculated to be compared against the M−1 measured phases. These M−1 reference phases (e.g., denoted ref phases[M−1: 1]) represent the expected transition counts that would occur between the first selected multiphase clock and the remaining M−1 multiphase clocks (e.g., the multiphase clocks selected as the second multiphase clock in step 404) if all M multiphase clocks were separated by equally spaced phase offsets (e.g., the ideal or expected phase offsets). Ref phases[M−1:1] may be calculated from the sampling period Tm and the frequency scaling between the multiphase clocks and ref_clk 101, represented by the programmable divider ratio 115 of PLL 102.

For example, in one embodiment, the expected number of transitions of ref_clk 101 within a period of multiphase clks [M−1:0] for a sampling period of Tm (e.g., in seconds) may be calculated as the product of Tm and the frequency of ref_clk 101, or equivalently as the product of Tm and the frequency of multiphase clks[M−1:0] divided by programmable divider ratio 115. Ref phase[i] is then calculated by multiplying the expected number of transitions of ref_clk 101 within a period of multiphase clks[M−1:0] by a fraction of the period of the multiphase clock represented by the expected phase offset between multiphase clk[0] and clk[i]. For example, ref phase[2] is the expected transition count between multiphase clk[0] and multiphase clk[2]. The expected phase offset between multiphase clk[0] and multiphase clk[2] is 2/8 of the period of multiphase clks[M−1:0].

Therefore, ref phase[2] is calculated by multiplying the expected number of transitions of ref_clk 101 within a period of multiphase clks[M−1:0] by 2/8.

In step 406, a phase skew value is generated for each of the second selected multiphase clocks. For example, in one embodiment, M−1 phase skew values (e.g., denoted as phase skews[M−1:1]) are generated which are the differences between the M−1 measured phases (e.g., denoted as measured phases[M−1:1] determined in step 404) and corresponding M−1 reference phases (e.g., denoted as ref phases [M−1:1] determined in step 405). Thus, phase skews[M−1:1] are the differences between the measured transition counts and the expected transition counts for the M−1 second selected multiphase clocks with respect to the first selected multiphase clock and are measures of the amount of deviation of the phase offsets of each of the M−1 second selected multiphase clocks from equally spaced phase offsets (e.g., equal phase spacing).

In step 407, it is determined whether the phase skew values are substantially zero or within a specified range for the M−1 second selected multiphase clocks with respect to the first selected multiphase clock. If the phase skew value for a second selected multiphase clock i, phase skew[i], is not substantially zero or is outside the specified range, phase adjustment of multiphase clock i is made using phase skew[i] in step 408. This may be accomplished using multiphase phase adjustment block 110 of FIG. 1. Phase adjustments may be made for any of multiphase clocks 113 as may be desired based on the phase skew values. After all phase adjustments are made, the method returns to step 401 and repeats until the phase skew values are substantially zero or within the specified range for all the M−1 second selected multiphase clocks. The method of FIG. 4 then ends (step 409).

Figure 5:
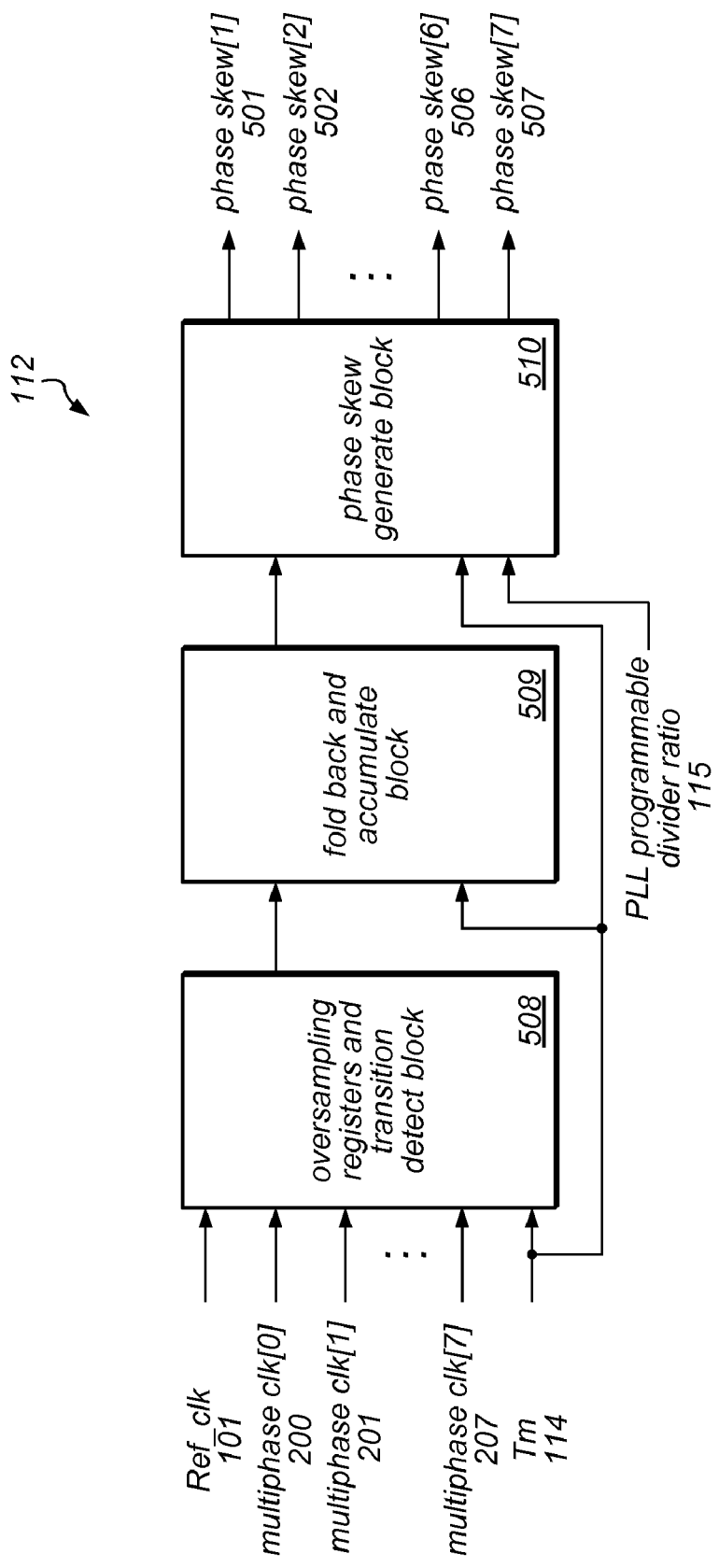
FIG. 5 shows an implementation of a skew measurement block according to one or more embodiments of the present disclosure.

FIG. 5 shows an implementation of skew measurement block 112 according to one or more embodiments of the present disclosure. In one embodiment, skew measurement block 112 may be used to implement the method of FIG. 4. As shown in FIG. 5, an oversampling registers and transition detect block 508 receives ref_clk 101, multiphase clks[7:0] (207-200), and signal 114 (e.g., identifying sampling period Tm). In one embodiment, oversampling registers and transition detect block 508 implements steps 401 and 402 of FIG. 4. In this regard, oversampling registers and transition detect block 508 oversamples ref_clk 101 with multiphase clks[7:0] into Rxdata[N−1:0] and detects transitions between adjacent Rxdata[N−1:0]. The number of samples in Rxdata[N−1:0] is a function of the sampling period Tm and the frequency of multiphase clks[7:0] (207-200). For example, for the 8 multiphase clocks of multiphase clks[7:0] (207-200), the number of samples for a sampling period of Tm is the product of 8 times Tm times the frequency of multiphase clocks multiphase clks[7:0] (207-200).

A fold back and accumulate block 509 receives the detected transitions between adjacent Rxdata[N−1:0] from oversampling registers and transition detect block 508, and also receives signal 114. In one embodiment, fold back and accumulate block 509 implements step 403 of FIG. 4. Transition counts of ref_clk 101 between eight pairs of sampling edges of multiphase clks[7:0] (207-200) are accumulated for the duration of the sampling period Tm to generate eight transition counts.

A phase skew generate block 510 receives the eight transition counts from fold back and accumulate block 509, and also receives signal 114 and signal 115 (e.g., identifying the programmable divider ratio). In one embodiment, phase skews generate block 510 implements steps 404, 405, and 406 of FIG. 4. In this regard, if multiphase clk[0] (200) is the first selected multiphase clock, then phase skew generate block 510 generates 7 phase skew values (denoted as phase skews[7:1] (507-501) that identify the deviation of the phase offsets of multiphase clks[7:1] (207-201) from equal phase spacing.

Figure 6:
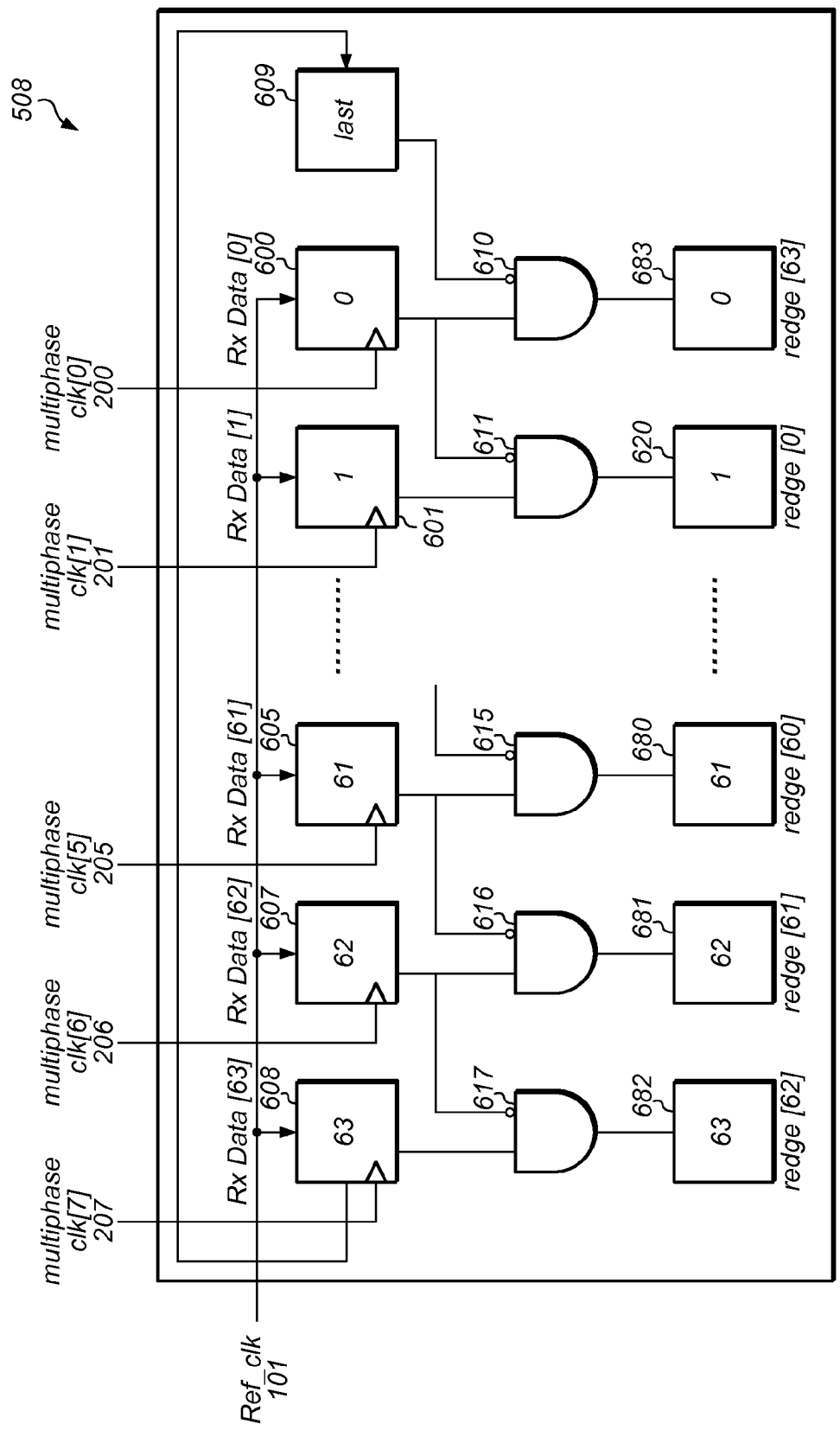
FIG. 6 shows an implementation of an oversampling registers and transition detect block of FIG. 5 according to one or more embodiments of the present disclosure.

FIG. 6 shows an implementation of oversampling registers and transition detect block 508 of FIG. 5 according to one or more embodiments of the present disclosure. Ref clk 101 is sampled by multiphase clks[7:0] (207-200) and stored in groups of 64 registers Rxdata[63:0] (608-600). The number of samples for sampling period Tm represented by Rxdata[N−1:0] may exceed 64 and may be divided into groups of 64 samples for storage into Rxdata[63:0] (608-600). In one embodiment, ref_clk 101 is continually being sampled and processing of Rxdata[63:0] (608-600) is implemented to be fast enough to keep up with new samples of ref_clk 101. In such an embodiment, transition detection between adjacent Rxdata registers should be completed before the Rxdata registers are written with the new samples of ref_clk 101. Accordingly, a last register 609 is provided to hold the last sample in Rxdata[63]. Rising edge detection between samples stored in adjacent Rxdata registers is accomplished using gates 617-610. For example, gate 611 detects a rising edge between Rxdata[1] (601) and Rxdata[ ] (600) when ref_clk 101 has a rising edge transition between multiphase clk[0] (200) and multiphase clk[1] (201). The detected transitions are stored into redges registers[63:0] (683-620).

Figure 7:
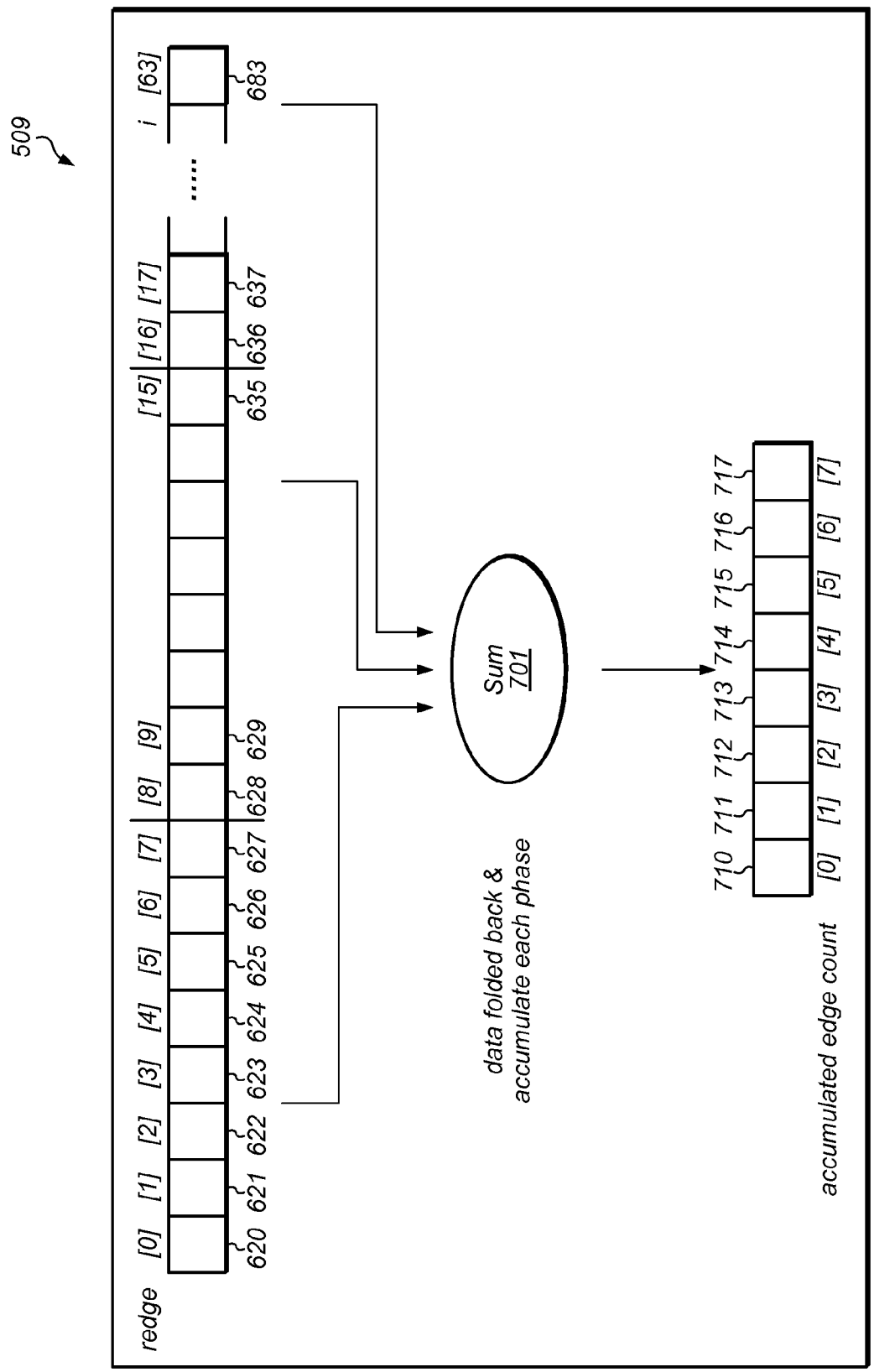
FIG. 7 shows an implementation of a fold back and accumulate block of FIG. 5 according to one or more embodiments of the present disclosure.

FIG. 7 shows an implementation of fold back and accumulate block 509 of FIG. 5 according to one or more embodiments of the present disclosure. Detected transitions in redges[63:0] (683-620) occurring between identical pairs of multiphase clk[7:0] (207-200) are accumulated in a sum block 701. For example, to count transitions between multiphase clk[0] (200) and multiphase clk[1] (201), sum block 701 accumulates redge[0], redge[8], redge[16], redge[56]. For multiphase clks[7:0] (207-200), detected transitions between eight pairs of multiphase clocks are accumulated. The eight transition counts for the eight pairs of multiphase clocks are stored in accumulated edge count[7:0] (717-710). Thus, accumulated edge count[0] stores the transition count between multiphase clk0 (200) and multiphase clk1 (201); accumulated edge count[1] stores the transition count between multiphase clk[1] (201) and multiphase clk[2] (202), and so forth.

Figure 8:
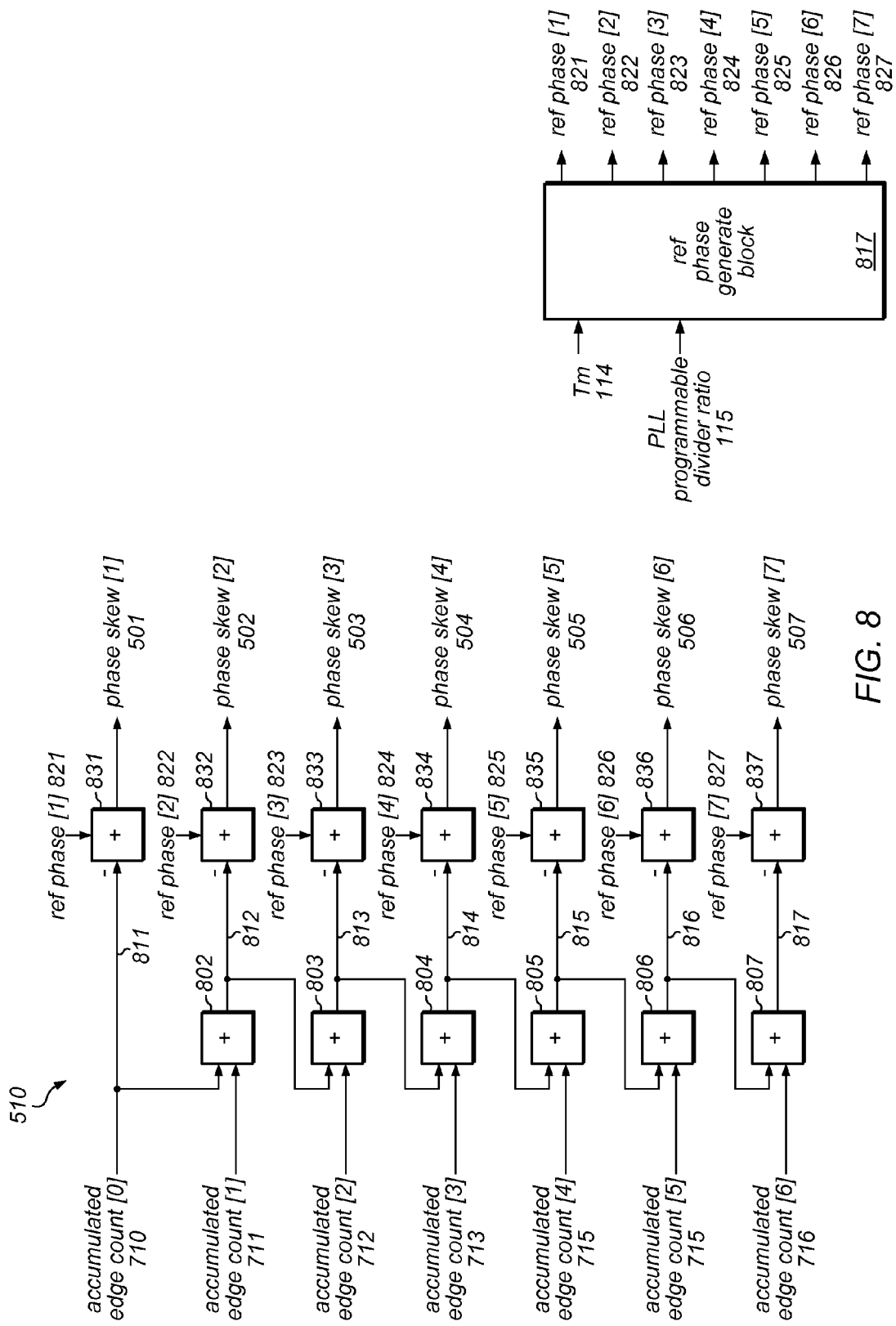
FIG. 8 shows an implementation of a phase skew generate block of FIG. 5 according to one or more embodiments of the present disclosure.

FIG. 8 shows an implementation of phase skew generate block 510 of FIG. 5 according to one or more embodiments of the present disclosure. Multiphase clk[0] is the first selected multiphase clock and the transition counts between the other M−1 multiphase clocks and multiphase clk[0] are accumulated (e.g., summed) to provide a measured phase for each of the other M−1 multiphase clocks as discussed. Summing of the transition counts is accomplished using adders 802-807. For example, to generate the measured phase[7] between multiphase clk[7] 207 and multiphase clk[0] 200, accumulated edge counts[6:0] (716-710) are summed through adders 802-807. This summation is performed because between the sample edges of multiphase clk[7] 207 and multiphase clk[0] 200 there are seven pairs of intervening multiphase clocks: the pair including multiphase clk[0] 200 and multiphase clk[1] 201, the pair including multiphase clk[1] 201 and multiphase clk[2] 202, the pair including multiphase clk[2] 202 and multiphase clk[3] 203, the pair including multiphase clk[3] 203 and multiphase clk[4] 204, the pair including multiphase clk[4] 204 and multiphase clk[5] 205, the pair including multiphase clk[5] 205 and multiphase clk[6] 206, the pair including multiphase clk[6] 206 and multiphase clk[7] 207, and the pair including multiphase clk[6] 206 and multiphase clk[7] 207. Signals 817-811 represent the measured phases between each of multiphase clk[7:1] (207-201) and multiphase clk[0] 200. These measured phases[7:1] (817-811) are compared against their corresponding reference phases, denoted as ref phases[7:1] (827-821) generated from a ref phase generate block 817.

Ref phases[7:1] (827-821) represent the expected transition counts between each of multiphase clks[7:1] (207-201) and multiphase clk[0] 200. Ref phases[7:1] (827-821) may be calculated from the sampling period Tm 114 and the programmable divider ratio 115. For example, for an index i, ref phase[i] is calculated by multiplying the expected number of transitions of ref_clk 101 within a period of multiphase clks[7:0] (207-200) by the proportion of the period of the multiphase clock represented by the phase offset between multiphase clk[i] and clk[0].

The differences between the measured phases[7:1] (817-811) and ref phases[7:1] (827-821) are calculated by summers 837-831 to generate the phase skew values denoted as phase skews[7:1] (507-501). Phase skews[7:1] (507-501) represent deviations of the phase offsets of multiphase clks[7:1] (207-201) from equal phase spacing.

Figure 9:
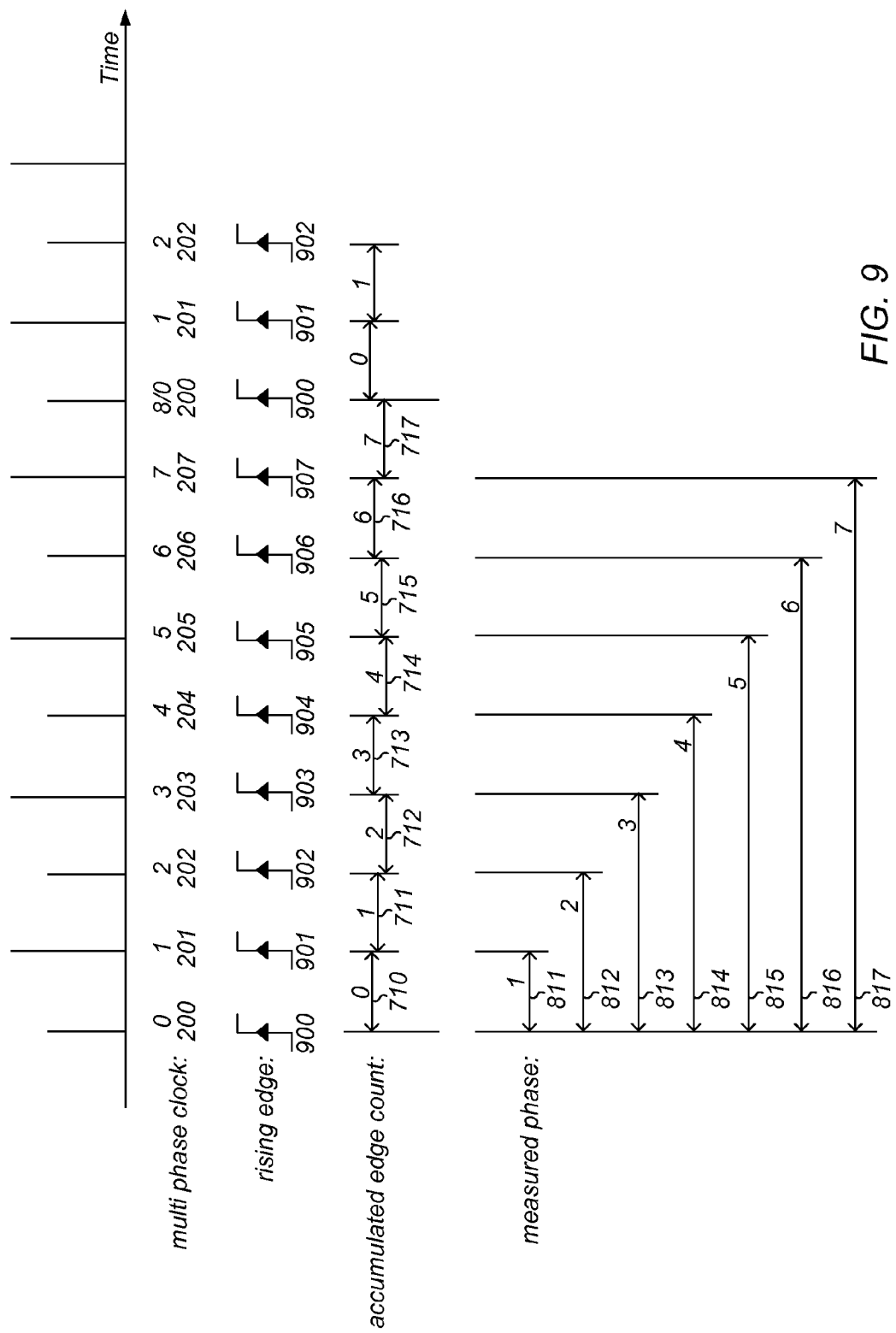
FIG. 9 illustrates relationships between phase offsets of multiphase clocks, accumulated transition counts, and measured phases of the skew measurement block of FIG. 5 according to one or more embodiments of the present disclosure.

FIG. 9 illustrates relationships between offsets of multiphase clks[7:0] (207-200), accumulated transition counts, and measured phases of skew measurement block 112 of FIG. 5 according to one or more embodiments of the present disclosure. Multiphase clks[7:0] (207-200) have sampling edges 907-900, respectively. Accumulated transition counts between the rising edges of the eight pairs of multiphase clks[7:0] (207-200) for the sampling period are stored in accumulated edge counts[7:0] (717-710). Multiphase clk[0] 200 is the first selected multiphase clock and the transition counts between multiphase clks[7:1] (207-201) and multiphase clk[0] 200 are represented as measured phases[7:1] (signals 817-811).

Figure 10:
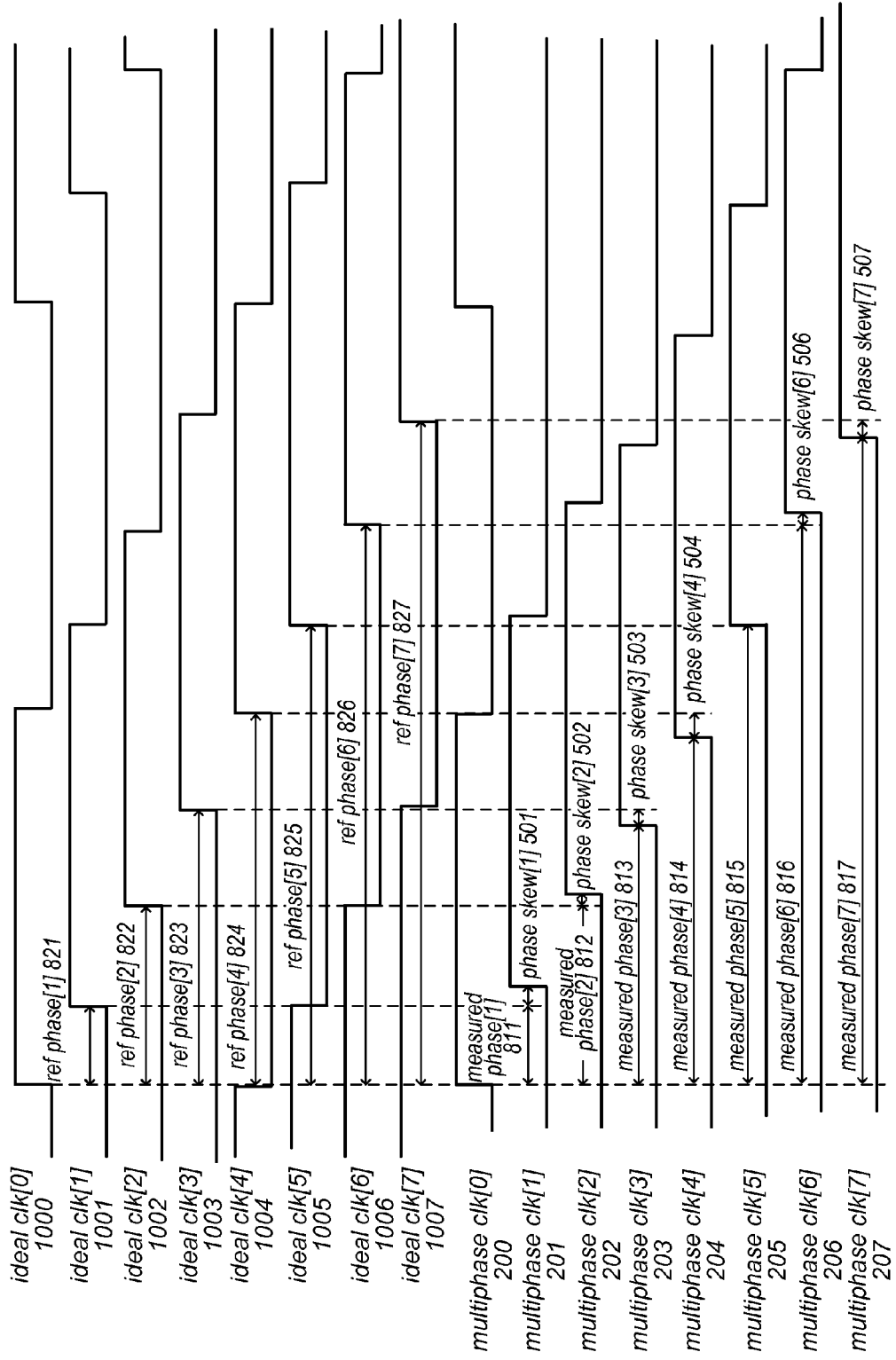
FIG. 10 illustrates deviations from ideal phase offsets for multiphase clocks according to one or more embodiments of the present disclosure.

FIG. 10 illustrates deviations from ideal phase offsets for multiphase clks[7:0] (207-200) of FIG. 5 according to one or more embodiments of the present disclosure. Ideal clks[7:0] (1007-1000) represent eight multiphase clocks with equal phase spacing. Ideal clk[0] (1000) is the first selected multiphase clock. Ref phases[7:1] (827-821) are the expected phase offsets for ideal clks[7:1] (1007-1001) with respect to ideal clk[0] (1000). Ref phases[7:1] (827-821) represent the expected number of transitions of ref_clk 101 between the sampling edges of ideal clks[7:1] (1007-1001) and ideal clk[0] (1000).

Multiphase clks[7:0] (207-200) represent the generated multiphase clocks. Multiphase clk[0] (200) is the first selected multiphase clock. Measured phases[7:1] (817-811) are the measured phase offsets for multiphase clks[7:1] (207-201) with respect to multiphase clk[0] (200). Measured phases[7:1] (817-811) represent the measured number of transitions of ref_clk 101 between the sampling edges of multiphase clks[7:1] (207-201) and multiphase clk[0] (200). Phase skews[7:1] (507-501) are the differences between ref phases[7:1] (827-821) and measured phases[7:1] (817-811) for multiphase clks[7:1] (207-201).

The various components described herein may be implemented with appropriate hardware and/or software to perform the various operations described herein. For example, in various embodiments, such components may include one or more processors, logic, memory, non-transitory machine readable instructions (e.g., software, firmware, or other instructions stored in a memory or a machine readable medium), and/or other components as may be desired in particular implementations.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method comprising:
   receiving a reference clock;
   sampling the reference clock with a plurality of multiphase clocks to generate a plurality of samples, wherein the reference clock has a first frequency and the multiphase clocks have a second frequency, wherein the second frequency is a non-integer multiple of the first frequency;
   detecting transitions of the reference clock occurring between the samples generated from a plurality of pairs of the multiphase clocks;
   counting the transitions to generate a transition count for each of the pairs of the multiphase clocks;
   summing a set of the transition counts to generate a measured phase for a first one of the multiphase clocks;
   calculating a reference phase for the first one of the multiphase clocks; and
   generating a phase skew value for the first one of the multiphase clocks based on the measured phase and the reference phase.

2. The method of claim 1, wherein there is no sampling edge of any of the other multiphase clocks between sampling edges of each pair of the multiphase clocks.

3. The method of claim 2, wherein the set of transition counts comprises the transition counts for all of the pairs of the multiphase clocks wherein a sampling edge of each multiphase clock of each pair is either between sampling edges of the first one of the multiphase clocks and a second one of the multiphase clocks, or is the sampling edge of the first one or the second one of the multiphase clocks.

4. The method of claim 1, wherein the sampling is performed over a measurement period selected to allow the transitions of the reference clock to be substantially equally distributed between sampling edges of each of the pairs of the multiphase clocks.

5. The method of claim 1, wherein the calculating the reference phase comprises calculating an expected number of transitions of the reference clock occurring between sampling edges of the first one of the multiphase clocks and a second one of the multiphase clocks over a measurement period.

6. The method of claim 5, wherein the calculating the reference phase comprises:
   multiplying the first frequency by the measurement period to generate an expected number of total transitions; and
   multiplying the expected number of total transitions by a fraction of a period of the multiphase clocks represented by a phase offset between sampling edges of the first one of the multiphase clocks and the second one of the multiphase clocks.

7. The method of claim 1, wherein the generating a phase skew value comprises calculating a difference between the measured phase and the reference phase.

8. The method of claim 1, further comprising adjusting a phase offset of the sampling edge of the first one of the multiphase clocks if the phase skew value is not substantially zero.

9. The method of claim 8, further comprising repeating the sampling, detecting, counting, summing, calculating, generating, and adjusting until the phase skew value is substantially zero.

10. The method of claim 1, further comprising performing the summing for a plurality of sets of the transition counts, the calculating for a plurality of reference phases, and the generating for a plurality of phase skew values to provide the phase skew values for a plurality of the multiphase clocks.

11. An apparatus comprising:
   a plurality of oversampling registers adapted to store a plurality of samples of a reference clock sampled with a plurality of multiphase clocks, wherein the reference clock has a first frequency and the multiphase clocks have a second frequency, wherein the second frequency is a non-integer multiple of the first frequency;
   a transition detect block adapted to detect transitions of the reference clock occurring between the samples generated from a plurality of pairs of the multiphase clocks;
   an accumulator block adapted to count the transitions to generate a transition count for each of the pairs of the multiphase clocks; and
   a phase skew generate block adapted to sum a set of the transition counts to generate a measured phase for a first one of the multiphase clocks, calculate a reference phase for the first one of the multiphase clocks, and generate a phase skew value for the first one of the multiphase clocks based on the measured phase and the reference phase.

12. The apparatus of claim 11, wherein there is no sampling edge of any of the other multiphase clocks between sampling edges of each pair of the multiphase clocks.

13. The apparatus of claim 12, wherein the set of transition counts comprises the transition counts for all of the pairs of the multiphase clocks wherein a sampling edge of each multiphase clock of each pair is either between sampling edges of the first one of the multiphase clocks and a second one of the multiphase clocks, or is the sampling edge of the first one or the second one of the multiphase clocks.

14. The apparatus of claim 11, wherein the samples of the reference clock are sampled over a measurement period selected to allow the transitions of the reference clock to be substantially equally distributed between sampling edges of each of the pairs of the multiphase clocks.

15. The apparatus of claim 11, wherein the phase skew generate block is adapted to calculate the reference phase based on an expected number of transitions of the reference clock that occur between sampling edges of the first one of the multiphase clocks and a second one of the multiphase clocks over a measurement period.

16. The apparatus of claim 15, wherein the phase skew generate block is adapted to:
   multiply the first frequency by the measurement period to generate an expected number of total transitions; and
   multiply the expected number of total transitions by a fraction of a period of the multiphase clocks represented by a phase offset between sampling edges of the first one of the multiphase clocks and the second one of the multiphase clocks to calculate the reference phase.

17. The apparatus of claim 11, wherein the phase skew generate block is adapted to calculate a difference between the measured phase and the reference phase to calculate the phase skew value.

18. The apparatus of claim 11, wherein the phase skew generate block is further adapted to generate a phase skew signal to adjust a phase offset of the sampling edge of the first one of the multiphase clocks if the phase skew value is not substantially zero.

19. The apparatus of claim 18, wherein the apparatus is adapted to repeatedly store the samples, detect the transitions, count the transitions, sum the set of the transition counts, calculate the reference phase, generate the phase skew value, and adjust the phase offset until the phase skew value is substantially zero.

20. The apparatus of claim 11, wherein the apparatus is adapted to sum a plurality of sets of the transition counts, calculate a plurality of reference phases, and generate a plurality of phase skew values to provide the phase skew values for a plurality of the multiphase clocks.

21. The apparatus of claim 11, wherein a number of the oversampling registers is greater than a number of the multiphase clocks.

22. A machine readable medium adapted to store a plurality of non-transitory machine readable instructions which when executed by one or more processors of a device are adapted to cause the device to:
   sample a reference clock with a plurality of multiphase clocks to generate a plurality of samples, wherein the reference clock has a first frequency and the multiphase clocks have a second frequency, wherein the second frequency is a non-integer multiple of the first frequency;
   detect transitions of the reference clock occurring between the samples generated from a plurality of pairs of the multiphase clocks;
   count the transitions to generate a transition count for each of the pairs of the multiphase clocks;
   sum a set of the transition counts to generate a measured phase;
   calculate a reference phase; and
   generate a phase skew value based on the measured phase and the reference phase.

* * * * *